(12) United States Patent
Ando

(10) Patent No.: US 6,957,163 B2
(45) Date of Patent: Oct. 18, 2005

(54) INTEGRATED CIRCUITS HAVING POST-SILICON ADJUSTMENT CONTROL

(76) Inventor: Yoshiyuki Ando, Nishi 3-2-62 Kunitachi-shi, Tokyo (JP), 186-0005

( * ) Notice: Subject to any disclaimer, the term of this patent is extended or adjusted under 35 U.S.C. 154(b) by 46 days.

(21) Appl. No.: 10/707,450

(22) Filed: Dec. 15, 2003

(65) Prior Publication Data

US 2004/0111231 A1 Jun. 10, 2004

Related U.S. Application Data

(63) Continuation-in-part of application No. 10/063,450, filed on Apr. 24, 2002, now Pat. No. 6,792,379.

(51) Int. Cl.[7] .............................................. H05K 17/62
(52) U.S. Cl. ........................................ 702/130; 702/99
(58) Field of Search ................................ 702/130, 132, 702/99; 341/121; 327/524, 525, 530, 535, 545

(56) References Cited

U.S. PATENT DOCUMENTS

| | | | | |
|---|---|---|---|---|
| 5,781,060 A | * | 7/1998 | Sugawara | .................. 327/407 |
| 5,996,083 A | * | 11/1999 | Gupta et al. | ................. 713/322 |
| 6,006,169 A | * | 12/1999 | Sandhu et al. | ............... 702/132 |
| 6,345,362 B1 | * | 2/2002 | Bertin et al. | ................. 713/300 |
| 6,662,302 B1 | * | 12/2003 | Garey | ......................... 713/324 |
| 6,772,352 B1 | * | 8/2004 | Williams et al. | ............ 713/300 |
| 2003/0142550 A1 | * | 7/2003 | Kawahara et al. | ..... 365/185.28 |

* cited by examiner

*Primary Examiner*—Marc S. Hoff
*Assistant Examiner*—Craig Steven Miller
(74) *Attorney, Agent, or Firm*—Richard D. Fuerle

(57) ABSTRACT

An integrated circuit system has a reference data table for holding information that is used to control at least one circuit block in the system and also has a power supply circuit, a body bias control circuit, a clock delivery circuit, a temperature monitor circuit, and/or a configuration control circuit. The performance of the system is improved by obtaining system performance data by testing the system at different supply voltages, different body-bias voltages, different clock speeds, and/or different temperatures. Values based on the data are entered into the reference data table. The power supply circuit, the body bias control circuit, the clock delivery circuit, and/or the temperature monitor circuit data is adjusted using the entered values.

40 Claims, 7 Drawing Sheets

INTEGRATED CIRCUITS HAVING POST-SILICON ADJUSTMENT CONTROL

This application is a continuation-in-part of application Ser. No. 10/063,450, filed Apr. 24, 2002 now U.S. Pat. No. 6,792,379, titled "Data-Based Control of Integrated Circuits."

BACKGROUND OF INVENTION

Summary of Invention

This invention relates the use of data obtained by testing integrated circuit (IC) chips to control the performance of the IC chip. In particular, it relates to simulating the operation of an integrated circuit chip and programming the reference data table of the chip with information based on data obtained from that simulation.

Integrated circuit (IC) chips are being required to have higher execution speeds and better performances. In order to meet such requirements, IC chips having a million or more transistors are placed on a die. This requires that narrower dimensions, such as 130 nm or less, must be used. Manufacturing chips that precisely is difficult due to variations in threshold voltages, the resistance of wires, and the capacitance of lines. These variations are introduced during the deposition of layers, thermal annealing, and other processes. In the paper, "Impact of Die-to-Die and Within-Die Parameter Fluctuations on the Maximum Clock Frequency Distribution for Gigascale Integration," by Keith A. Bowman, IEEE Journal of Solid-State Circuits, Vol. 37, No. 2, Feb., 2002, these parameter fluctuations are shown to influence the maximum operating frequency or power consumption distributions within a die or between dies. This paper predicts that when 50 nm technology is employed, a generation of performance improvements may be lost due to systematic within-die fluctuations.

Another difficulty is the power consumption problem. Million or gigascale integration requires a huge power consumption. Some microprocessors already require more than 50 W per die, which necessitates the use of a cooling system, such as a fan. Even when a cooling system is used, the temperature of die will be above room temperature, in some cases up to 100° C. But initially the die is at ambient temperature which, in the case of a car or outside usage, could be -20° C. in the winter.

FIG. 1 of the paper, "A 4-GHz 130 nm Address Generation Unit With 32-bit Sparse-Tree Adder Core," by S. Mathew, et al., IEEE Journal of Solid-State Circuits, VOL. 38, No.5, May, 2003, gives a picture that shows the thermal distribution within die. In this picture there are hot-spots in the die. Thus, there are problems in IC chips with parameter fluctuations and extreme operating temperatures, as well as local parameter fluctuations and internal thermal distributions.

The paper, "Effectiveness of Adaptive Supply Voltage and Body Bias for Reducing Impact of Parameter variations in Low Power and High Performance Microprocessors," by James W. Tschanz, etal., IEEE Journal of Solid-State Circuits, VOL. 38, No.5, May, 2003, shows that controlling the adaptive supply voltage and the body bias is effective in overcoming problems with those parameter variations.

In U.S. Pat. No. 5,710,800, the supply voltage and clock rate are controlled using an internal control circuit.

In U.S. Pat. No. 6,345,362, each functional unit in an IC chip has an independently controllable threshold voltage. The instructions to a chip are decoded to determine which functional units are needed to execute the instructions. The process speed of the units can then be adjusted to the optimal power level. A status table indicates the present power status of each of the functional units and a requirements table identifies the units required to execute a particular instruction.

In U.S. Pat. No. 5,996,083, the rate of program execution is controlled by software that changes the data bus width and the power latency values. The power consumption per second can be decreased by changing the data bus width from 64 bits to 32 bits, but this approximately doubles the program execution time. The execution time for each program is determined by the clock rate and the power latency, which is the time required to change the applied voltage or the status condition (e.g., standby or execute). The power latency time is needed to stabilize the applied power and the program execution and it adds to the total consumption of power and the total operation speed. Changes in data bus width and power latency are controlled by the instruction program. In U.S. Pat. No. 5,996,083, the power consumption or program execution speed is improved by changing the program using an internal control circuit.

In U.S. Pat. No. 6,484,265, software control technology by supply voltage, clock signal, and body bias for performance, power consumption, and temperature control is disclosed.

In those technologies the values the control circuit works with are predetermined for the chips. The control circuit becomes complicated when it covers various cases or various parameter fluctuations.

DETAILED DESCRIPTION

Figure 1:
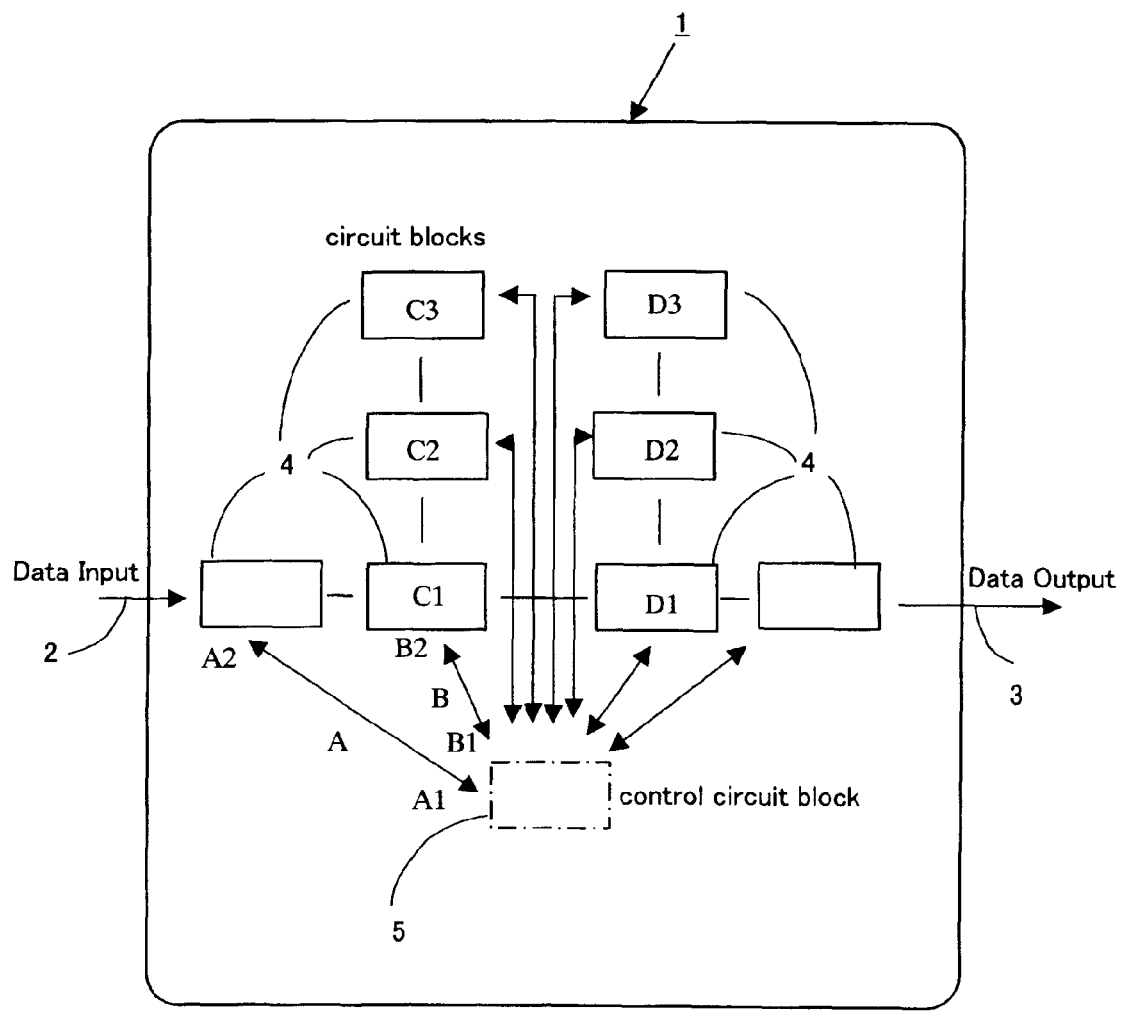
FIG. 1 is a schematic diagram of an IC chip.

In FIG. 1, large scale integrated circuit (LSI) chip 1, either as one of many IC chips on a wafer or as an assembled individual IC chip, has a data input 2 and a data output 3. Chip 1 comprises numerous partitioned circuit blocks 4, each of which has an internal temperature monitor circuit, or some temperature-generating or temperature-sensitive blocks have such monitors, but the temperature monitor circuit could also comprise a single circuit block 4. Control circuit block 5 controls various parameters of circuit blocks 4, such as clock speed, operation clock speed, supply voltage, and body-bias voltage.

Figure 2:
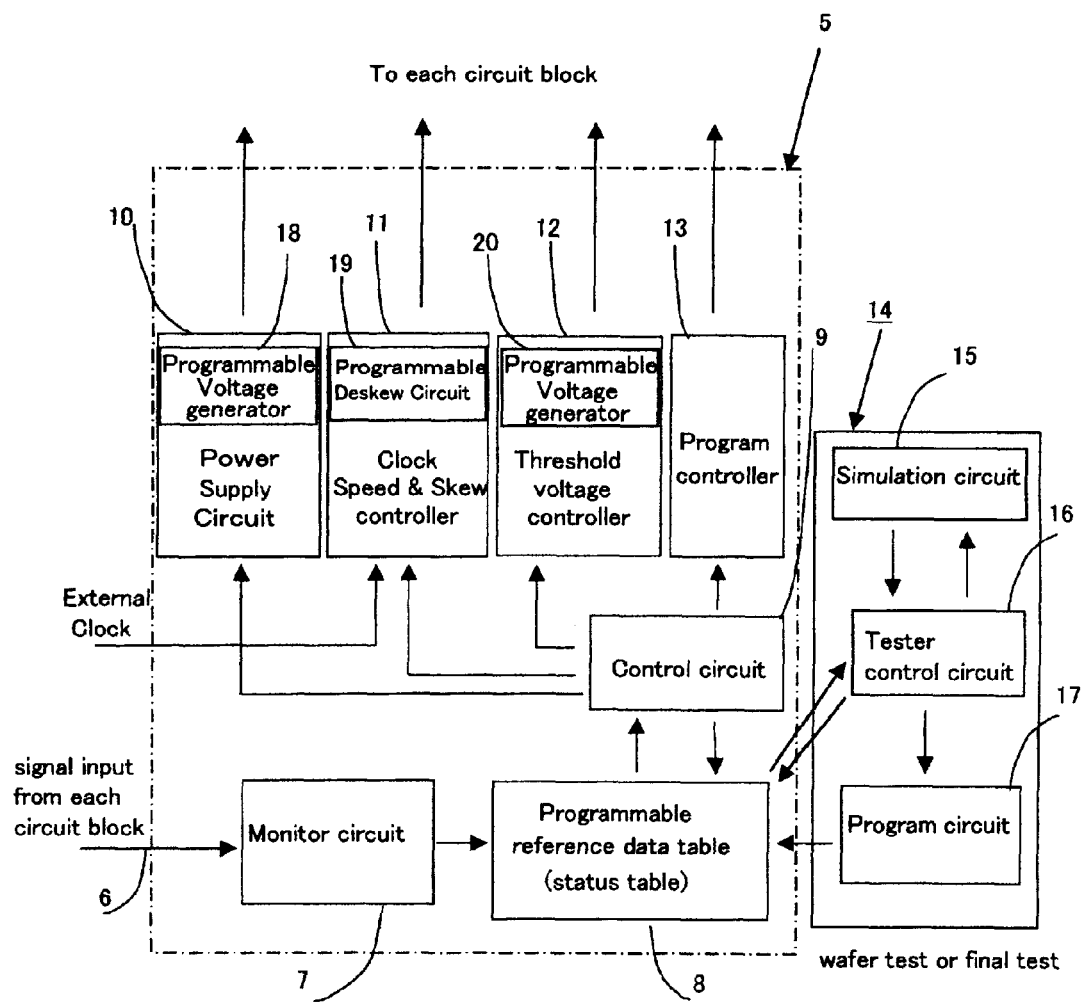
FIG. 2 is a schematic diagram of the control circuit shown in FIG. 1 and a simulation tester.

In FIG. 2, signal input 6 from each circuit block 4 contains information such as whether a circuit block is operating or is on stand-by, the temperature of the circuit block and, if it is operating, at what clock speed it is operating and/or what program it is executing. Signal input 6 goes to monitor circuit 7, which determines which circuit blocks will be used next and at what clock speeds they will be used. Monitor circuit 7 accesses programmable reference data table 8 for the supply voltage, body-bias voltage, or other conditions needed to attain the desired performance, such as clock speed. For each circuit block 4, control circuit 9 sends the supply voltage to be used to programmable supply voltage generator 10, which then generates the programmed supply voltage; control circuit 9 sends the clock speed to be used to programmed clock speed and programmed skew controller 11, which sets the clock speed to be used; control circuit 9 sends the body-bias voltage to be used to programmable threshold voltage controller 12, which sets the programmed threshold voltage by controlling the body-bias voltage; and control circuit 9 sends the instructions to be used to the program controller 13, which changes the program of the instruction sets, such as the data bus width, or changes each circuit block configuration program set, such as the rotation of the same function circuit block. The programmable voltage generator 18 is part of power supply circuit 10, programmable deskew circuit 19 is part of clock speed and skew controller 11, and programmable voltage generator 20 is part of threshold voltage controller 12.

Programmable reference data table 8 contains information, such as clock speed, power usage, or operating voltage range, that is required attain a desired performance. The following is an example of the type of information that can be placed in table 8 for various temperatures:

| | Conditions Required to Obtain Desired Clock Speed | |
|---|---|---|
| Desired Clock Speed (GHz) at 110° C. | Supply Voltage (V) | Body-Bias Voltage (V) for an N-type MOS Transistor |
| 1.0 | 3.0 | −0.4 |
| 1.5 | 3.2 | −0.3 |
| 2.0 | 3.4 | +0.2 |
| 2.5 | 3.6 | +0.4 |

Because power is current times voltage, the power used by a circuit block can be controlled by controlling its supply voltage. The supply voltages and body-bias voltages in the programmable reference data table should be considered to be target voltages and voltages slightly above or below the target voltages may be permitted by the control circuits.

Table 8 may contain data for an entire chip or it may contain different data for different circuit blocks 4 on a chip. It could even contain different data for different transistors or different groups of transistors on a chip. This data is accessed by control circuit 9 so that circuit blocks 4 (FIG. 1) operate at the optimal speed and voltages at various temperatures.

Previously, the values in reference data table 8 were determined by the design of the chip. That is, the clock speeds, supply voltages, and body bias voltages that the chip was designed to operate at were entered into reference data table 8. However, as explained hereinabove, each chip is slightly different and the designed values may not be the optimal values for any particular chip. (See "Impact of Die-to-Die and Within-Die Parameter Fluctuations on the Maximum Clock Frequency Distribution for Gigascale Integration," by Keith A. Bowman, IEEE Journal of Solid-State Circuits, VOL. 37, No. 2, Feb. 2002. )

Referring again to FIG. 2, in this invention reference data table 8 is programmable and values based on measured data are entered into table 8. Tester 14 tests chips to determine whether the chips are acceptable. The test can be performed when the chips are part of a wafer or when individual chips have been cut from a wafer, assembled, and are ready to be shipped, or at both times. The test is preferably performed while the chips are on a wafer, however, as that is more economical.

Tester 14 has a simulation circuit 15, which provides one or more programs for the chip to execute, a control circuit 16, which controls the clock speeds, supply voltages, body-bias voltages, and programs of instruction sets used in the test, and the programs to be executed by the chip. The test can be performed on the entire chip and data can be entered into the table for the entire chip. Alternatively, the test can be perform on individual circuit blocks, or even on individual transistors or groups of transistors, and data can be entered into table 8 for each circuit block, transistor, or group of transistors. The test typically consists of determining whether the chip can successfully execute one or more programs at various clock speeds, supply voltages, body-bias voltages, and programs of instruction sets at various temperatures. Preferably, for use in battery-powered computers, the chip is tested at 2 to 4 different supply voltages between 1 and 4 volts, at 2 to 4 different body-bias voltages between −0.5 and +0.5 volts, and at 2 to 4 different clock speeds between 1 and 300 MHz at maximum and minimum desired temperatures. Preferably, for use in plug-in computers, the chip is tested at 2 to 4 different supply voltages between 1 and 4 volts, at 2 to 4 different body-bias voltages between −0.5 and +0.5 volts, and at 2 to 4 different clock speeds between 0.2 and 2 GHz at maximum and minimum desired temperatures. Of course, as chips improve, the preferred test voltages may fall while clock speeds increase. The test may also be performed at other conditions, such as at different temperatures, for example, between 0 and 110° C. Typically, the data obtained is the minimum supply voltages and minimum body-bias voltages used in the test at which the chip successfully executed a program at each clock speed tested. The data may also show that the operating voltage values should be different from the predetermined voltage values, which may change the range of the operating voltages.

Control circuit 16 also evaluates the results of the test and, based on the test results, selects values to be entered into table 8. Data obtained during testing may be "adjusted" to allow for a margin of error or for other reasons. Program circuit 17 then programs table 8 by entering values based on the test data into it. The values can be permanently fixed in table 8 by, for example, the anti-fuse method, the non-volatile memory method, or by other methods. In the anti-fuse method (see U.S. Pat. No. 5,324,681, herein incorporated by reference), a value is fixed in table 8 by burning out a "fuse" in the chip. U.S. Pat. No. 6,319,773B1, herein incorporated by reference, describes the non-volatile memory method. Alternatively, the values can be tentatively entered into table 8 so that the chip can be retested and new values entered into the table at a later time. Tentative values may be useful to allow for erroneous testing or changes in the chip or the requirements for its use.

In yet another embodiment of this invention, circuit blocks 4 that contain a MEMS (Micro Electro Mechanical Systems) are adjusted post-silicon. U.S. Pat. No. 6,639,488 discloses a mechanical switch for RF (Radio Frequency). This kind of mechanical system using semiconductor technology is affected by processing variations. Therefore, its performance, like applied voltage or electrical specifications for switching, is different for each die or wafer. Therefore, when a circuit block has a MEMS component, a post-silicon adjustment according to this invention can be made.

Off-chip programmable memory can be used when the memory of the reference data table is not adequate. For example, the internal memory capacity may be insufficient or the memory manufacturing process may be difficult to merge with other circuit manufacturing processes. Therefore, while in the hereinabove example all the circuits are implemented on one chip, some off-chip circuit blocks are also contemplated.

In another aspect of this invention, the supply circuit is adjusted post-silicon using measured values. The operating circuit blocks are influenced by parameter fluctuations that affect operation voltage, operating clock speed, and temperature range. Also, the supply voltage circuits, supply clock line delays, and temperature monitor circuits are influenced by parameter fluctuations, so those circuits can also benefit from post-silicon adjustment using measured values.

Figure 3:
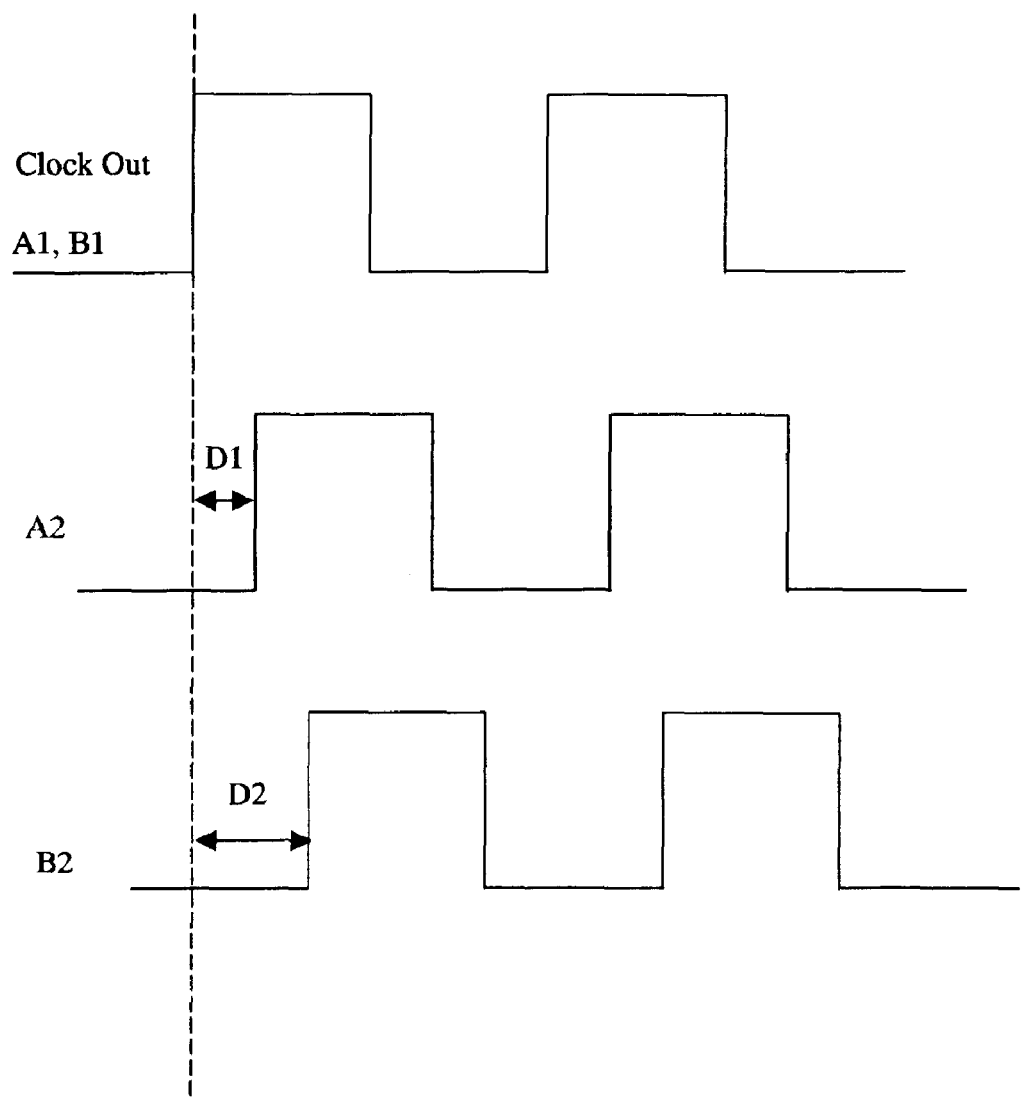
FIG. 3 is a diagram illustrating a clock wave form and a delay in two clock lines between starting points A1 and B1 and end points A2 and B2, respectively.

FIG. 3 shows the wave forms of the start points A1 and B1, and the end points A2 and B2, for the clock lines A and B in FIG. 1. The delay time for the clock line A is D1 and the delay time for the clock line B is D2 for the end points A2 and B2, respectively. For an accurate operation, the same clock time delay is needed for each circuit block. U.S. Pat. No. 6,594,807, herein incorporated by reference, discloses delay cell technology for minimizing this delay time.

Figure 4:
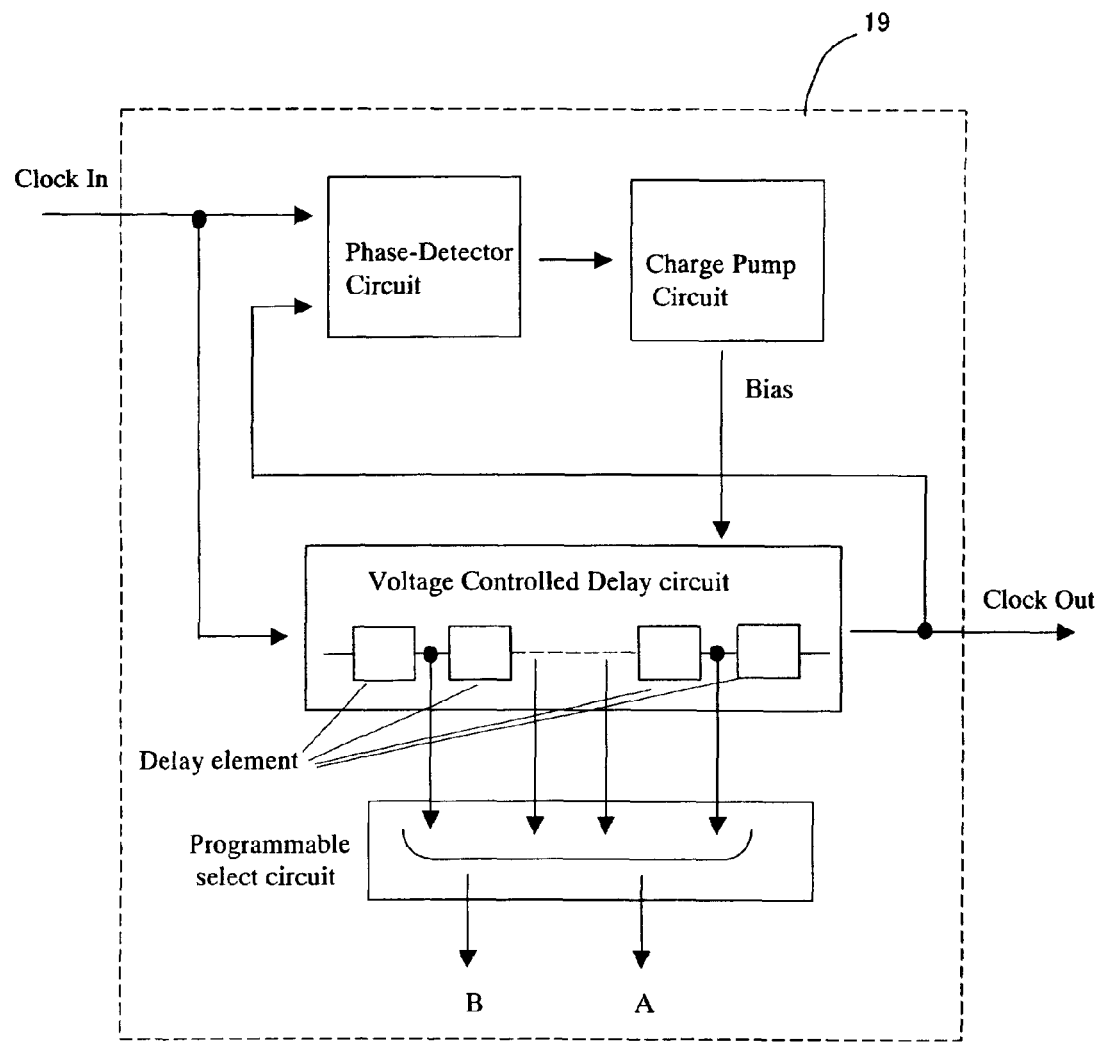
FIG. 4 is a diagram showing one embodiment of a deskew method for adjusting the delay time in clock lines A and B.
Figure 5:
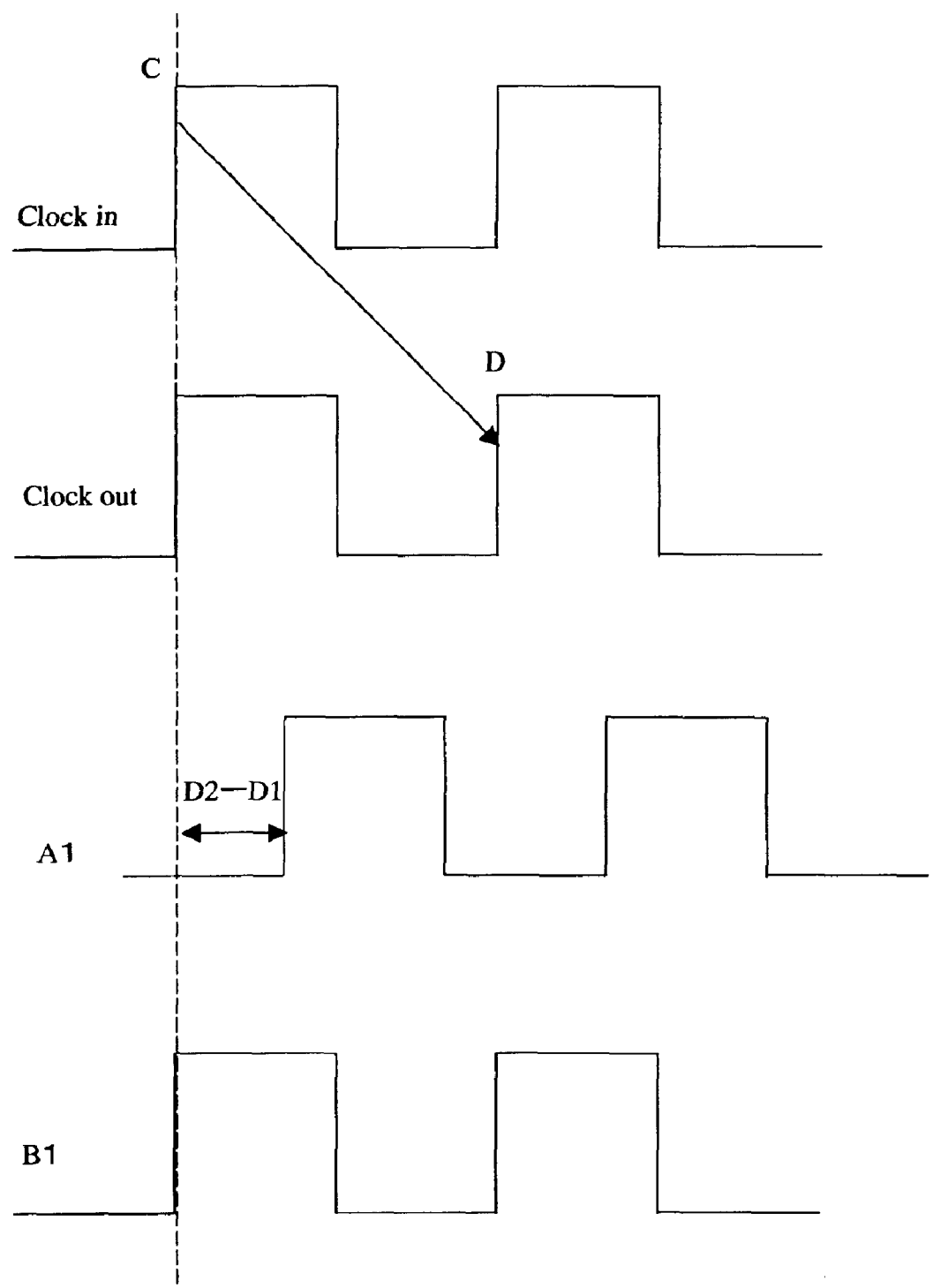
FIG. 5 is a diagram illustrating the results of using the deskew method shown in FIG. 4.

FIG. 4 shows a typical DLL (Delay Locked Loop) Circuit. This circuit is shown in U.S. Pat. No. 6,614,275, herein incorporated by reference. This circuit has a voltage controlled delay circuit which consists of plurality of delay elements whose delay time is controlled by the charge pump circuit bias. The phase detector circuit compares the clock in signal to the clock out signal and, if there is a phase difference between them, it sends an adjustment signal to the charge pump circuit. The charge pump circuit then sends a bias signal to the voltage controlled delay circuit to adjust its phase D to the one clock delayed phase of the clock in C (FIG. 5). One embodiment is to prepare many taps (e.g., connecting points such as A and B in FIG. 4) for the plurality of delay elements in the voltage controlled delay circuit. Each tap outputs each delayed clock between zero delays to one clock to the clock in. If there are time delays such as A2 and B2 in the delivered clock to each circuit block, the DLL circuit in programmable clock speed controller 19 of FIG. 2 delays clock line A by D2 minus D1 (see FIG. 5), using post-silicon technology, so that the delay time of clock lines A and B are adjusted to the maximum delay D2. For example, if there are 10 delay elements and 1 clock delay is 10 nsec, this means that the time from C to D is 10 nsec in FIG. 5, and that each delay element delays by 1 nsec. If the delay time of D1 is 3 nsec and the delay time of D2 is 7 nsec. then D1 must delay 4 nsec. This means that the A2 clock line would select the $4^{th}$ tap. This invention has an advantage in comparison to the above-described delay cell insertion technology (U.S. Pat. No. 6,614,275) because, whether each clock line has delay cell or not, this results in a different supply voltage or temperature dependence for each clock line. The instant invention, however, uses the same DLL circuit for each clock line, so that each clock line has the same dependence.

Figure 6:
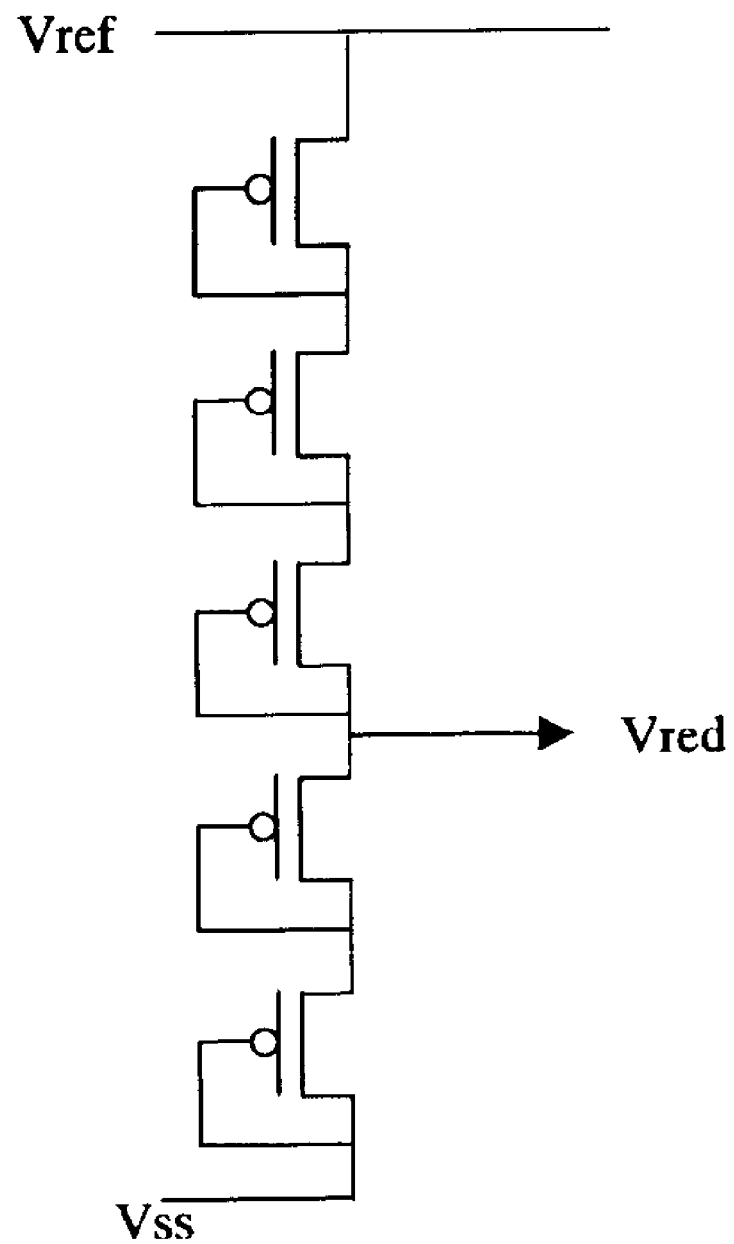
FIG. 6 is a diagram illustrating a voltage dividing circuit for a local voltage supply.
Figure 7:
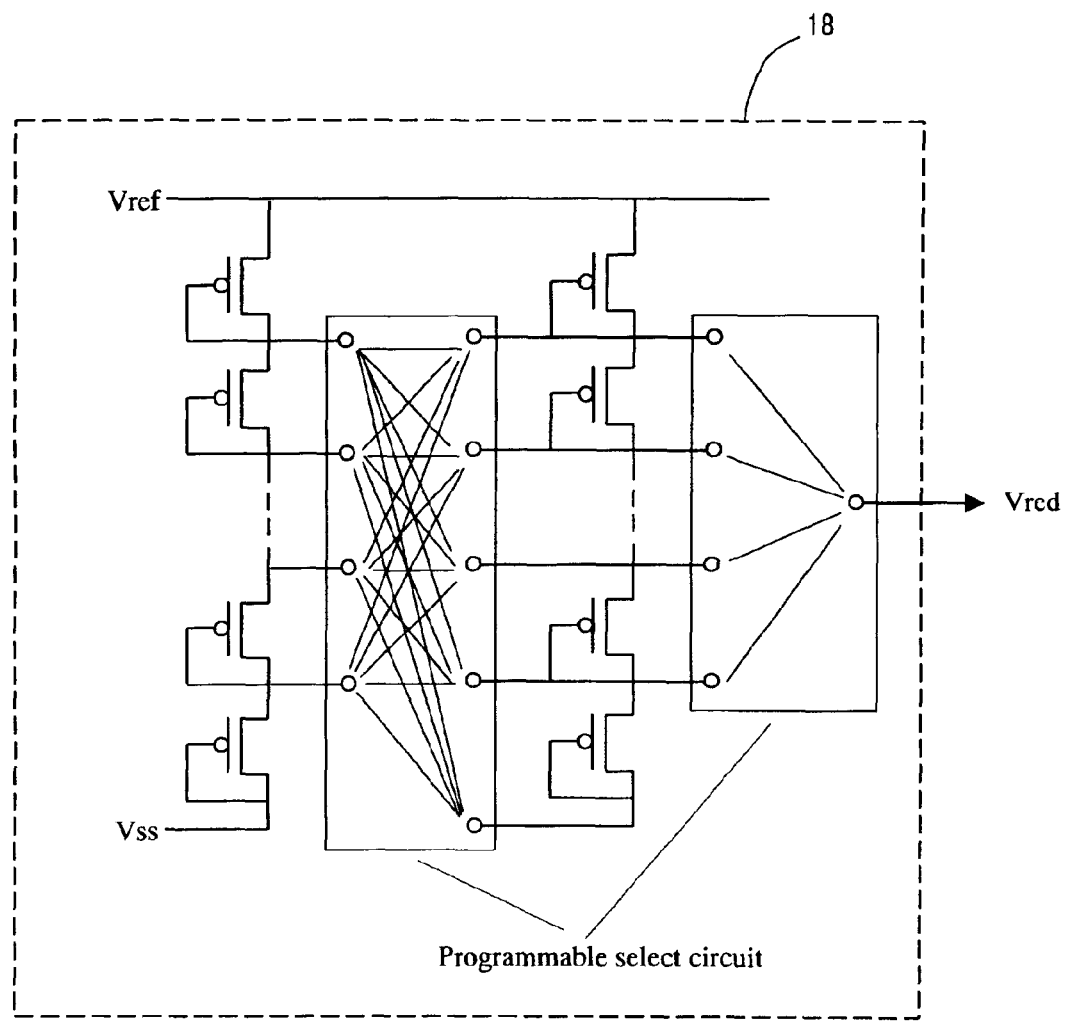
FIG. 7 is a diagram illustrating an embodiment for post-silicon adjusting a voltage dividing circuit.

In another embodiment, the local supply voltage generator circuit is post silicon adjusted. In U.S. Pat. No. 6,366,156, the supply voltage circuit is shown in FIG. 9 and in FIG. 1 of the U.S. Pat. No. 6,429,726, the supply voltage circuit is disclosed using a select circuit. Both circuits are for body bias circuits and use a fixed voltage divider circuit, which consists of serial connections of a MOS transistor. FIG. 6 of the instant invention illustrates a typical voltage divider circuit. In this circuit, Vred should be two-fifths (i.e., 40%) of Vref, but because of parameter fluctuations, each serially connected transistor character will be different, so the actual value of Vred may not be exactly two-fifths of Vref. FIG. 7 illustrates one example of a post-silicon adjustment of the local supply voltage circuit, where Vred is adjusted to desired value by the programmable select circuit.

In U.S. Pat. No. 5,890,100, a temperature monitor circuit is disclosed. This technology uses the delay time dependence of the inverter circuit to temperature (i.e., the delay time is usually a linear function of temperature, with higher temperatures having longer delay times). This delay time dependence to temperature is influenced by manufacturing parameter fluctuations. Other temperature monitor circuits are disclosed in U.S. Pat. No. 6,630,754 where bandgap reference voltage technology is used. This technology is substantially constant over a range of temperature and parameter fluctuations, but for sensing them a circuit analog to digital converter circuit is needed and this circuit is complicated and is influenced by parameter fluctuations.

A temperature monitor circuit gathers data on temperature variations for each circuit block and that information is used to control the operating voltage, body-bias voltage, or operating clock speed of that circuit block in order to maintain a predetermined temperature range or to optimize operating conditions for each temperature using a post-silicon adjustment. In one embodiment of this invention, measured data that shows temperature variations in the temperature monitor circuit for each circuit block are used to correct data in the reference table that is accessed by the temperature monitor circuit. For example, in the testing process the chip's ambient temperature may be changed from −10 to +110° C. During that time the chip doesn't operate and therefore doesn't generate heat. The tester monitors the ambient temperature of the chip, compares this data (e.g., voltage values) with data from the temperature monitor circuit in the chip being tested, and enters the correct data into the reference table for the chip. Currently, the temperature monitor circuit data output is a voltage value at a particular temperature that is based on designed data, and that designed data is inputted into the reference data table. But in this invention if, for example, the designed voltage value is 5 mV at +110° C. and the correct value at +110° C. is 7 mV, based on an actual test, then the correct voltage value at that temperature is entered into the reference data table. When the chip is allowing enough time to balance ambient temperature, the internal chip temperature will be equal to the ambient temperature because the chip will not be generating more heat than it loses.

In yet another aspect of this invention, a post-silicon adjustment is made to the circuit block configuration. As described before, FIG. 1 of the paper, "A 4-GHz 130 nm Address Generation Unit With 32-bit Sparse-Tree Adder Core," by S. Mathew, et al., IEEE Journal of Solid-State Circuits, VOL. 38, No. 5, May, 2003, shows the thermal distribution within a die. In this picture, there are hot-spots in the die. In order to avoid these hot spots in the die, a plurality of circuits that generate heat are used for the same function and the particular circuit used is changed by program controller circuit 13, which is controlled by control circuit 9 and monitor circuit 7, which monitors their temperatures, referring to data in programmable reference data table 8.

Referring to FIG. 1, circuit blocks of C1, C2, and C3 are the same circuit as the AGU (Address Generation Unit) or CPU (Central Processing Unit) core, which can create thermal hotspots. One embodiment of this invention is that in the testing process after fabricating the silicon wafers, the performance of each circuit is evaluated and prioritized. Then the reference data table is programmed according to which configuration of these circuits blocks is the most effective and creates the fewest thermal problems. Referring to FIG. 1, circuit blocks of D1, D2, and D3 each have identical cache memory blocks, which is requested fast access time. In the testing process, the performance of each cache memory block of D1, D2, and D3 is evaluated, including its access time and its temperature dependence. Then the reference data table is programmed to generate the most effective configuration for using those circuit blocks.

When these cache memories are large, one or more of D1, D2, and D3 may be set as off-chip dies. For example, the die including the control circuit and the programmable reference data table and D1, D2, and D3 dies are attached the same printed circuit board. After assembling these dies on a printed circuit board, this board is tested and its data is entered into the reference data table.

This invention is not limited to Si transistor or Si crystal wafer base integrated circuits, but can be applied to any integrated circuit, including analog circuits, SOI (Silicon On Insulator), Si—Ge, GaAs transistors, TFT (Thin Film Transistor), or carbon nano tube transistor based integrated circuits.

What is claimed is:

1. In an integrated circuit system having access to a reference data table for holding information used to control at least one circuit block in said system and having at least two of a power supply circuit, a body bias control circuit, a clock delivery circuit, a temperature monitor circuit, and a configuration control circuit, a method of improving the performance of said system comprising (A) obtaining system performance data by testing said system at at least two parameters selected from the group consisting of different supply voltages, different body-bias voltages, different clock speeds, different temperatures, different data bus widths, different circuit block configurations, and combinations thereof, where at least one of said parameters is different temperatures; and (B) entering values based on said data into said reference data table, where said temperature monitor circuit and at least one of said power supply circuit, said body bias control circuit, said clock delivery circuit, or said configuration control circuit is controlled using said values.

2. A method according to claim 1 wherein said system is tested at different supply voltages.

3. A method according to claim 1 wherein said system is tested at different body-bias voltages.

4. A method according to claim 1 wherein said system is tested at different clock speeds.

5. A method according to claim 1 wherein said system is tested at different circuit block configurations.

6. A method according to claim 1 wherein said reference data contains data for the entire system.

7. A method according to claim 1 wherein said reference data table contains data for one or more circuit blocks.

8. A method according to claim 1 wherein said reference data table is not on the same chip as the circuits controlled using data in said reference data table.

9. A method according to claim 1 wherein said system is one chip.

10. A method according to claim 9 wherein said system is tested when it is on a wafer.

11. A method according to claim 1 wherein said power supply circuit is adjusted using said values.

12. A method according to claim 1 wherein said clock delivery circuit is adjusted to minimize skew using said values.

13. A method according to claim 12 wherein said clock delivery circuit has a delay locked loop circuit.

14. A method according to claim 1 wherein said temperature monitor circuit data is adjusted using said values.

15. A method according to claim 1 wherein said system contains at least two blocks that can perform the same function and the block assigned to perform that function is determined using said values.

16. A method according to claim 1 wherein at least one but not all of said power supply circuit, said body bias control circuit, said clock delivery circuit, said temperature monitor circuit, and said configuration control circuit is controlled using designed values.

17. A method according to claim 1 wherein said test includes 2 to 4 different supply voltages between 1 and 4 volts at 2 to 4 different body-bias voltages between −0.5 and +0.5 volts and 2 to 4 different clock speeds between 1 and 300 MHz at a maximum and a minimum desired temperature.

18. A method according to claim 1 wherein said test includes 2 to 4 different supply voltages between 1 and 4 volts at 2 to 4 different body-bias voltages between −0.5 and +0.5 volts and 2 to 4 different clock speeds between 0.2 and 2 GHz at a maximum and a minimum desired temperature.

19. A method according to claim 1 wherein said data is used to adjust a MEMS component in said system.

20. A method according to claim 19 wherein data is entered into said reference data table post-silicon.

21. A method according to claim 1 wherein said reference data table is programmable.

22. A method according to claim 1 wherein said values are permanently entered into said reference data table.

23. A chip made according to the method of claim 1.

24. A computer comprising at least one chip according to claim 23.

25. A MEMS device having a programmable reference table in which data is entered after fabrication of said MEMS.

26. A MEMS device according to claim 25 that has temperature monitor circuit.

27. A MEMS device according to claim 25 wherein said MEMS and said programmable reference table are on different chips.

28. A MEMS device according to claim 25 wherein said programmable reference table contains applied voltage data for said MEMS.

29. In an integrated circuit system having a programmable reference data table for holding information used to control at least one of operation voltage, operating clock speed, and temperature range in a power supply circuit, a body bias control circuit, a clock delivery circuit, a temperature monitor circuit, and a configuration control circuit, a method of improving the performance of said system comprising (A) obtaining system performance data by testing said system at at least two parameters selected from the group consisting of different supply voltages, different body-bias voltages, different clock speeds, different temperatures, different data bus widths, different circuit block configurations, and combinations thereof, where at least one of said parameters is different temperatures; and (B) entering values based on said data into said reference data table, where said temperature monitor circuit and at least one of said operation voltage, operating body-bias voltage, operating clock speed, and temperature range in said power supply circuit, body bias control circuit, clock circuit, clock delivery circuit, or configuration control circuit is controlled using said values.

30. A chip made according to the method of claim 29.

31. A computer comprising at least one chip according to claim 30.

32. In an integrated circuit system having access to a reference data table, at least two same function circuit blocks, and a control circuit to control which of said circuit blocks executes a task, based on values in said reference data table, a method of improving the performance of said system comprising (A) obtaining system performance data by testing said system at at least two parameters selected from the group consisting of different supply voltages, different body-bias voltages, different clock speeds, different temperatures, different data bus widths, different circuit block configurations, and combinations thereof, where at least one of said parameters is different temperatures; and (B) entering values based on said data into said reference data table, whereby said control circuit selects or configures one of said blocks based on values in said reference data table.

33. A method according to claim 32 wherein at least one of said circuit blocks is on a different chip.

34. A chip made according to the method of claim 32.

35. A computer comprising at least one chip according to claim 34.

36. A method according to claim 1 wherein data is entered into said reference data table by a non-volatile memory method.

37. In an integrated circuit system having access to a reference data table for holding information used to control at least one circuit block in said system and having at least two of a power supply circuit, a body bias control circuit, a clock delivery circuit, a temperature monitor circuit, and a configuration control circuit, the improvement comprising a reference data table having values based on system performance data obtained by testing said system at at least two parameters selected from the group consisting of different supply voltages, different body-bias voltages, different clock speeds, different temperatures, different data bus widths, different circuit block configurations, and combinations thereof, where at least one of said parameters is different temperatures, entered into said reference data table, where said temperature monitor circuit and at least one of said power supply circuit, said body bias control circuit, said clock delivery circuit, or said configuration control circuit is controlled using said values.

38. An integrated circuit system according to claim 37 wherein data is entered into said reference table post-silicon.

39. An integrated circuit system according to claim 37 wherein data is entered into said reference table by a non-volatile memory method.

40. An integrated circuit system according to claim 37 wherein said integrated circuit system comprises one chip.

\* \* \* \* \*